(12) United States Patent
Huang (10) Patent No.: US 8,541,148 B2
(45) Date of Patent: Sep. 24, 2013

(54) METHOD FOR MAKING A LAMINATED CHIP AND METHOD FOR ALIGNING A LITHOGRAPHIC MASK

(75) Inventor: Chi-Chi Huang, Taichung (TW)

(73) Assignee: Max Echo Technology Corporation, Taichung (TW)

( * ) Notice: Subject to any disclaimer, the term of this patent is extended or adjusted under 35 U.S.C. 154(b) by 294 days.

(21) Appl. No.: 13/092,766

(22) Filed: Apr. 22, 2011

(65) Prior Publication Data

US 2011/0263122 A1 Oct. 27, 2011

(30) Foreign Application Priority Data

Apr. 26, 2010 (TW) .............................. 99113087 A (51) Int. Cl.
*H01L 21/00* (2006.01)
(52) U.S. Cl.
USPC .............................................. 430/5; 438/401

(58) Field of Classification Search
USPC .............................................. 430/5; 438/401
See application file for complete search history.

(56) References Cited

U.S. PATENT DOCUMENTS 4,513,203 A * 4/1985 Bohlen et al. .............. 250/491.1
5,293,025 A 3/1994 Wang

FOREIGN PATENT DOCUMENTS

| CN | 1069157 | 2/1993 |
| EP | 0525497 A1 | 3/1993 |
| WO | 93/19857 A1 | 10/1993 |

* cited by examiner

*Primary Examiner* — Richard Booth (57) ABSTRACT

A method for making a laminated chip includes: (a) forming a first conductive layer on a substrate; (b) forming an insulating layer on the first conductive layer opposite to the substrate; (c) bombarding the insulating layer using an electron beam to form a plurality of holes that expose the first conductive layer; and (d) forming a second conductive layer on the insulating layer such that a part of the second conductive layer extends into the holes to electrically connect to the first conductive layer.

3 Claims, 9 Drawing Sheets

METHOD FOR MAKING A LAMINATED CHIP AND METHOD FOR ALIGNING A LITHOGRAPHIC MASK

CROSS-REFERENCE TO RELATED APPLICATION

This application claims priority of Taiwanese application No. 099113087, filed on Apr. 26, 2010.

BACKGROUND OF THE INVENTION

1. Field of the Invention

This invention relates to a method for making a laminated chip and a method for aligning a lithographic mask.

2. Description of the Related Art

Figure 1:
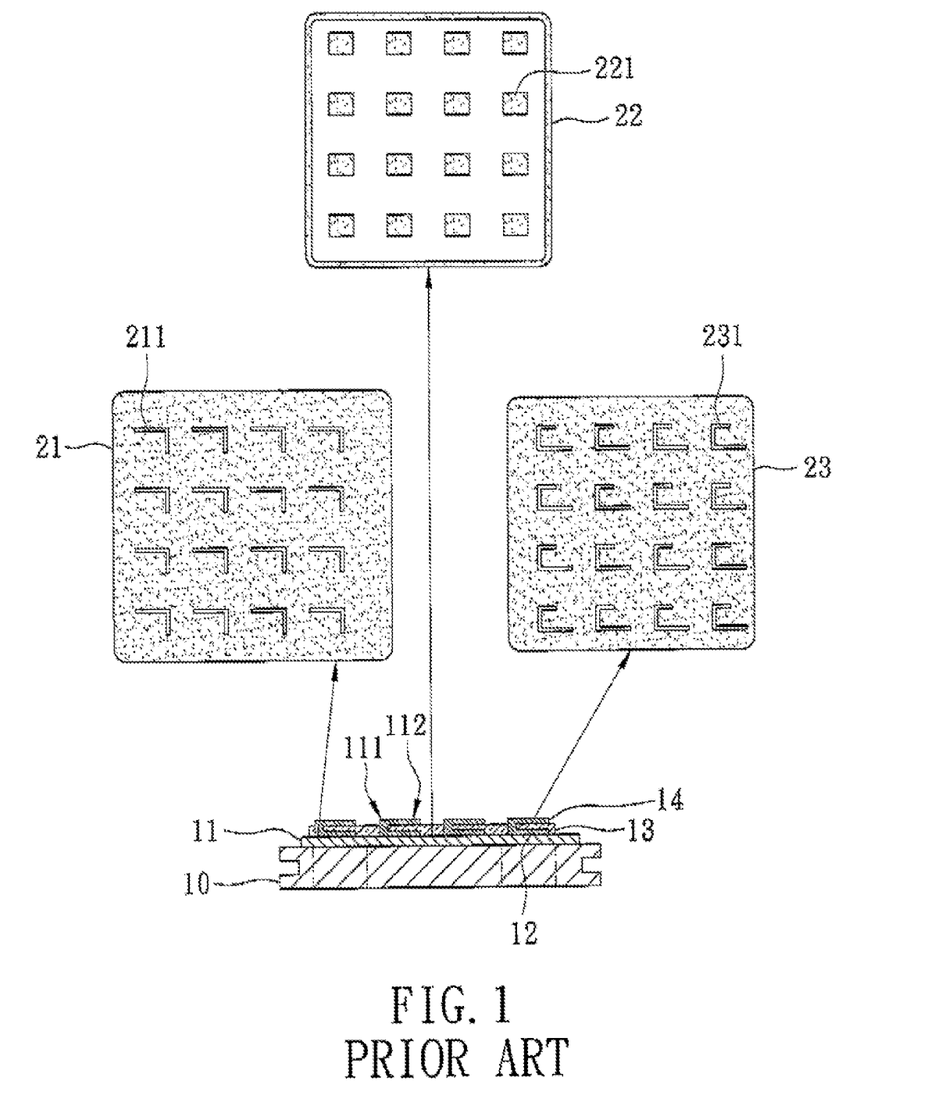
FIG. 1 is a schematic view showing a conventional method for making a laminated chip.

Referring to FIG. 1, a conventional method for making a laminated chip comprises: (a) providing a substrate 11 on a base 10; (b) forming a first patterned conductive layer 12 on the substrate 11 using a first lithographic mask 21 that has a first pattern 211; (c) forming a patterned insulating layer 13 on the first conductive layer 12 using a second lithographic mask 22 that has a second pattern 221, the second pattern 221 being different from the first pattern 211 such that a part of the first conductive layer 12 is exposed from the insulating layer 13; (d) forming a second patterned conductive layer 14 on the patterned insulating layer 13 using a third lithographic mask 23 that has a third pattern 231, the third pattern 231 being different from the first and second patterns 211, 221 such that a part of the second conductive layer 14 is formed on and connected to the exposed first conductive layer 12.

According to the designs of the first, second, and third patterns 211, 221, 231 of the first, second, and third lithographic masks 21, 22, 23, parts of the first and second conductive layers 12, 14 are connected to each other in connecting regions 111, and other parts of the first and second conductive layers 12, 14 are insulated from each other by the insulating layer 13.

In order to correctly form the patterned conductive layers 12, 14 and the patterned insulating layer 13 such that the first and second conductive layers 12, 14 may connect to each other at the predetermined connecting regions 111, the first, second, and third lithographic masks 21, 22, and 23 have to be accurately aligned during the method for making the laminated chip.

Moreover, when forming the patterned insulating layer 13 on the first conductive layer 12 using the second lithographic mask 22, the insulating material of the insulating layer 13, e.g., ceramic slurry, is likely to spread over the part of the first conductive layer 12 that is designed to be exposed from the insulating layer 13. Thus, the structural accuracy of the chip is adversely affected and short circuit and other circuit problems may be raised. Therefore, alignment of the lithographic mask during manufacture is necessary and significant.

Figure 2:
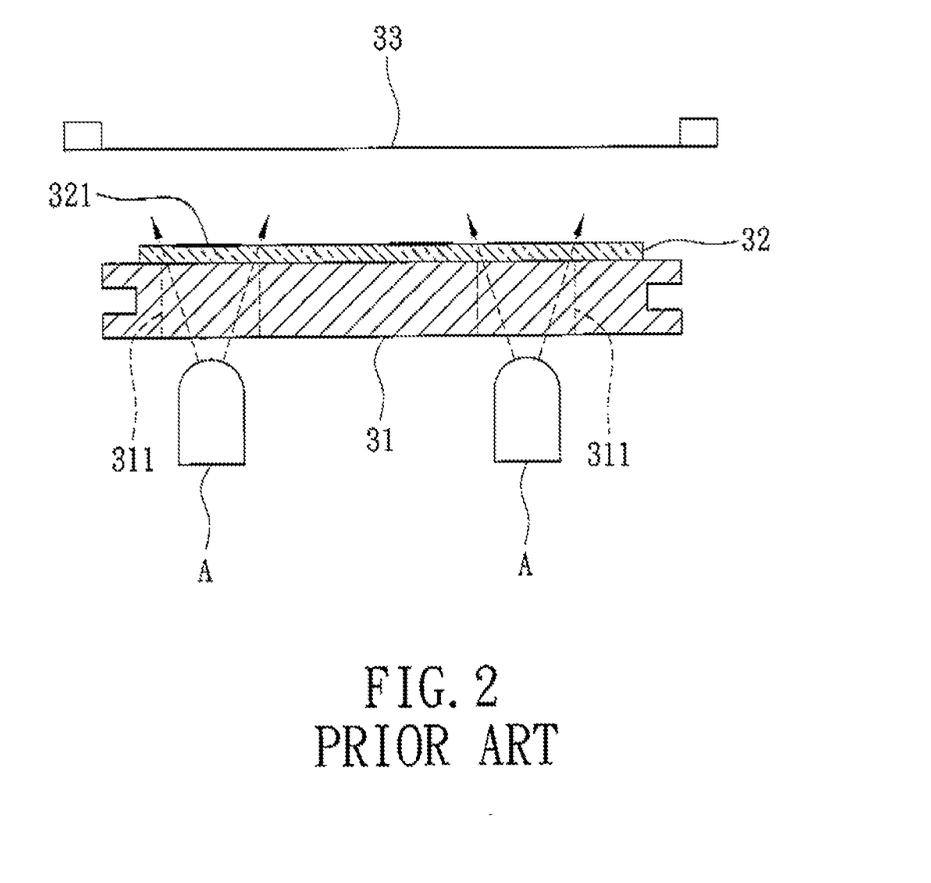
FIG. 2 is a schematic view showing a conventional method for aligning a lithographic mask.

Referring to FIG. 2, a conventional method for aligning a lithographic mask includes: forming a plurality of light-transmissible regions 311 on a base 31 of an alignment device; illuminating the light-transmissible regions 311 using a light source A such that the light-transmissible regions 311 serve as alignment references; laminating a patterned film 32 formed with a plurality of pattern structures 321, e.g., pattern holes, on the base 31 such that the pattern structures 321 are disposed corresponding to the light-transmissible regions 311 on the base 31; and disposing a lithographic mask 33 on the patterned film 32 in a way that mask alignment marks on the lithographic mask 33 are aligned with the pattern structures 321 of the patterned film 32.

In the aforesaid conventional method, before aligning the lithographic mask 33, it is necessary to separately prepare the patterned film 32 and align and laminate the film 32 on the base 31. These steps are conducted manually, thereby resulting in low accuracy, complicated manufacture, and increased costs.

SUMMARY OF THE INVENTION

Therefore, the objects of the present invention are to provide a method for making a laminated chip and a method for aligning a lithographic mask that can overcome the aforesaid drawbacks of the prior art.

According to a first aspect of the present invention, a method for making a laminated chip comprises: (a) forming a first conductive layer on a substrate; (b) forming an insulating layer on the first conductive layer opposite to the substrate; (c) bombarding the insulating layer using an electron beam to form a plurality of holes that expose a part of the first conductive layer; and (d) forming a second conductive layer on the insulating layer such that a part of the second conductive layer extends into the holes to electrically connect to the first conductive layer.

According to a second aspect of the present invention, a method for aligning a lithographic mask using an aligning device is provided. The lithographic mask has mask alignment marks, and the aligning device has a base that is formed with at least two separated light-transmissible sections. The method comprises: (a) disposing a light-transmissible film on the base; (b) bombarding the light-transmissible film at regions corresponding to the light-transmissible sections of the base using an electron beam so as to form film alignment marks on the light-transmissible film; and (c) disposing the lithographic mask on the light-transmissible film in a way that the mask alignment marks on the lithographic mask are aligned with the film alignment marks on the light-transmissible film.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Referring to FIGS. 3 to 6, the preferred embodiment of a method for making a laminated chip according to the present invention comprises the steps described below. The details of the general lithography process that are known to those skilled in the art are omitted here for brevity.

Figure 3:
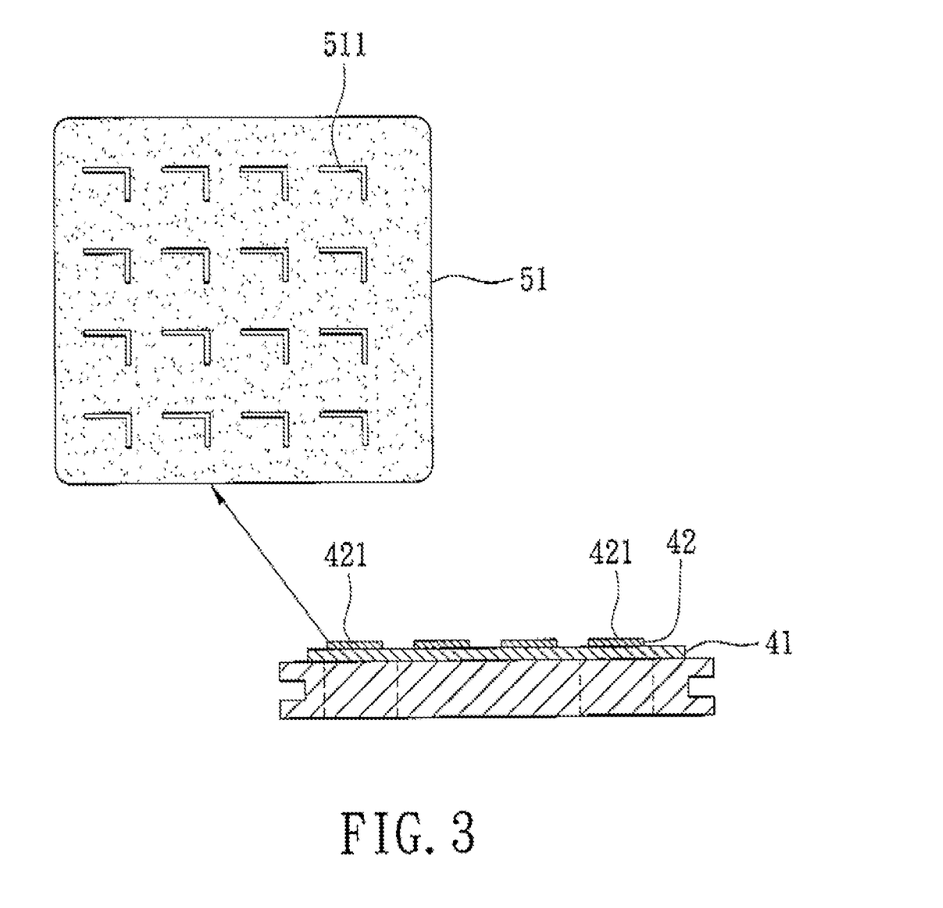
FIG. 3 to FIG. 6 show successive steps of the preferred embodiment of a method for making a laminated chip according to the present invention.

As shown in FIG. 3, a first conductive layer 42 is formed on a substrate 41 using a first lithographic mask 51 formed with a plurality of first pattern holes 511. The first conductive layer 42 is formed to include a plurality of first conductive regions 421 at locations corresponding to the first pattern holes 511 in the first lithographic mask 51.

Figure 4:
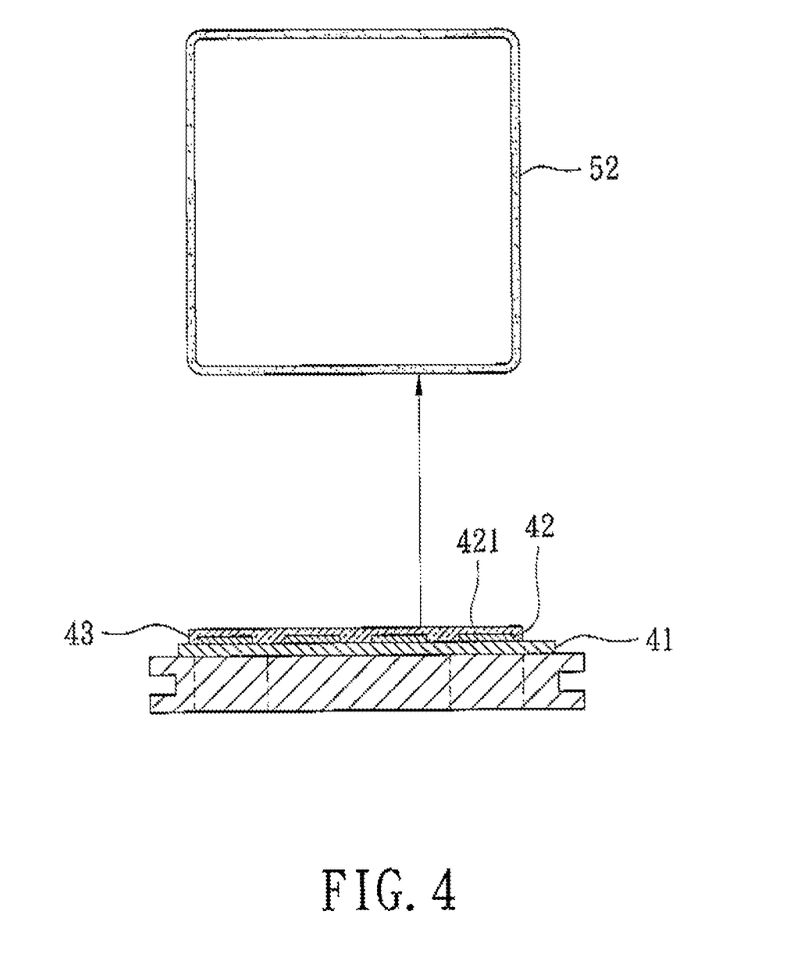

As shown in FIG. 4, an insulating layer 43 is formed on the first conductive layer 42 opposite to the substrate 41 using a hollow mask 52 such that the first conductive layer 42 is completely covered by the insulating layer 43.

Figure 5:
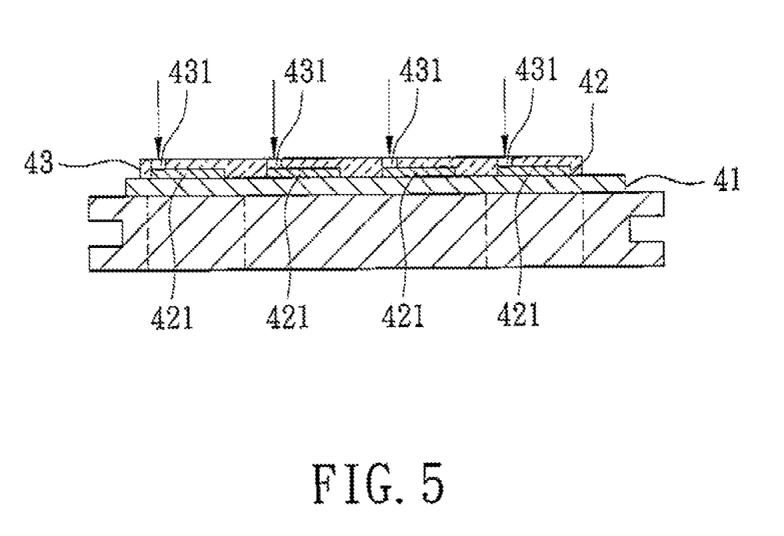

As shown in FIG. 5, the insulating layer 43 is then bombarded using an electron beam to form a plurality of holes 431 that expose a part of the first conductive layer 42. The electron beam is programmably controlled so as to bombard the insulating layer 43 at predetermined locations. It should be noted that the electron beam may be derived from a laser apparatus or any other devices.

Figure 6:
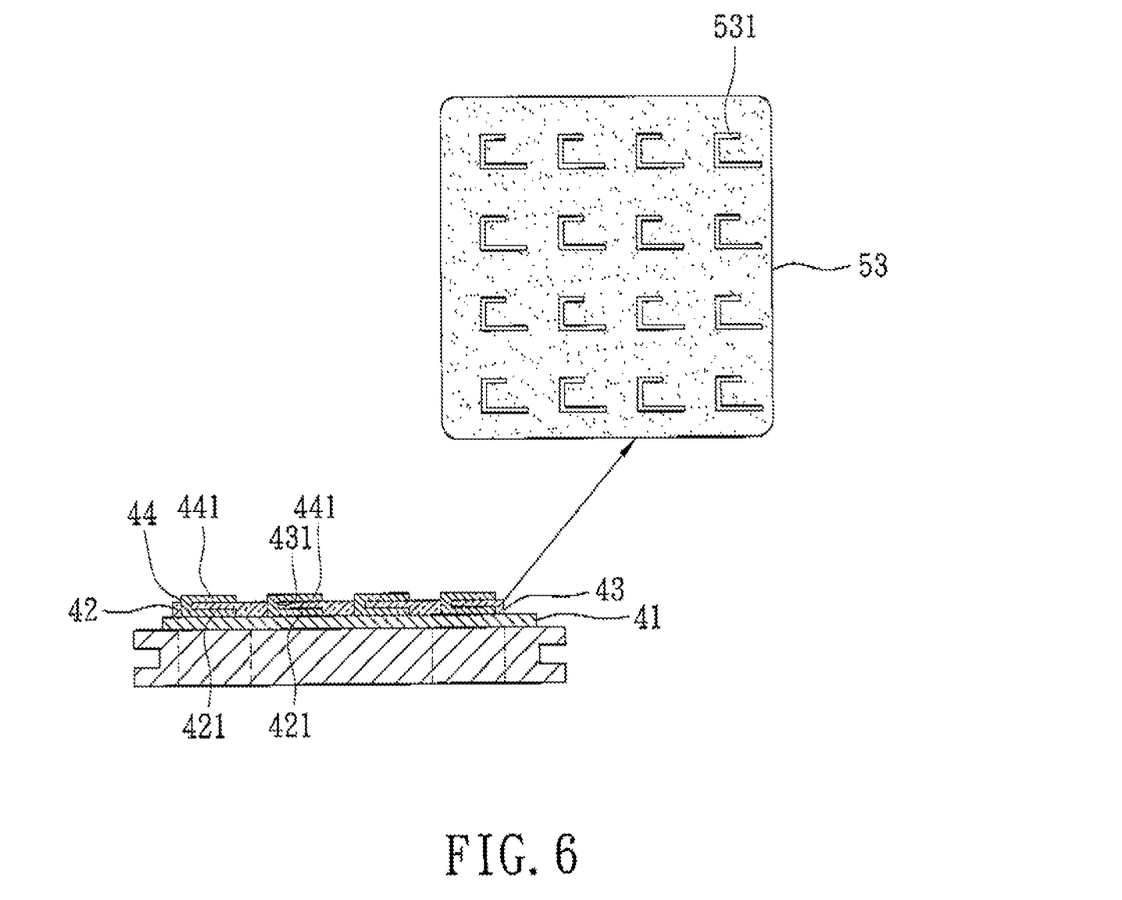

As shown in FIG. 6, a second conductive layer 44 is formed on the insulating layer 43 using a second lithographic mask 53 formed with a plurality of second pattern holes 531. The second conductive layer 44 is formed to include a plurality of second conductive regions 441 at locations corresponding to the second pattern holes 531 in the second lithographic mask 53. A part of the second conductive layer 441 extends into the holes 431 of the insulating layer 43 to electrically connect to the first conductive layer 42.

According to the aforesaid preferred embodiment, since the insulating layer 43 is formed using the hollow mask 52 that is not patterned, the alignment of the hollow mask 52 may be omitted, thereby simplifying the manufacture of the laminated chip. More importantly, since the holes 431 are bombarded after formation of the insulating layer 43, the holes 431 may be formed more accurately at predetermined locations and the problem that the insulating material of the insulating layer 43 covers the exposed first conductive layer 42 can be eliminated. Therefore, the laminated chip made from the aforesaid method has improved quality.

Figure 7:
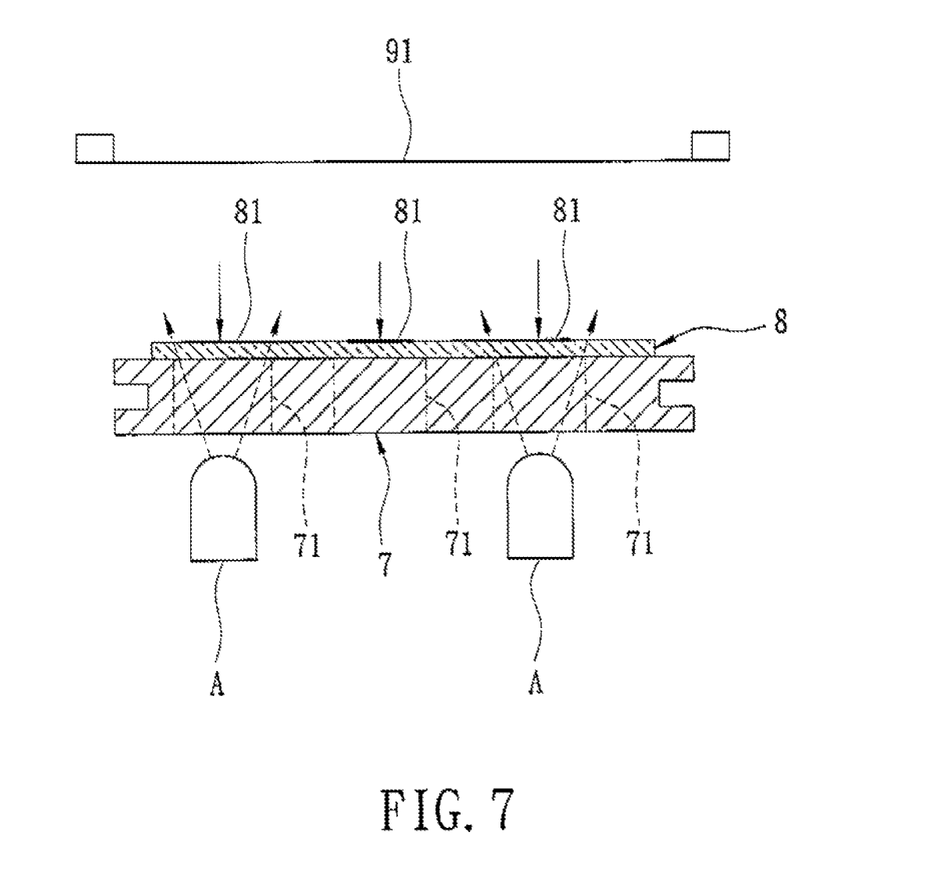
FIG. 7 is a schematic view illustrating the bombarding step of the preferred embodiment of a method for aligning a lithographic mask according to the present invention.
Figure 8:
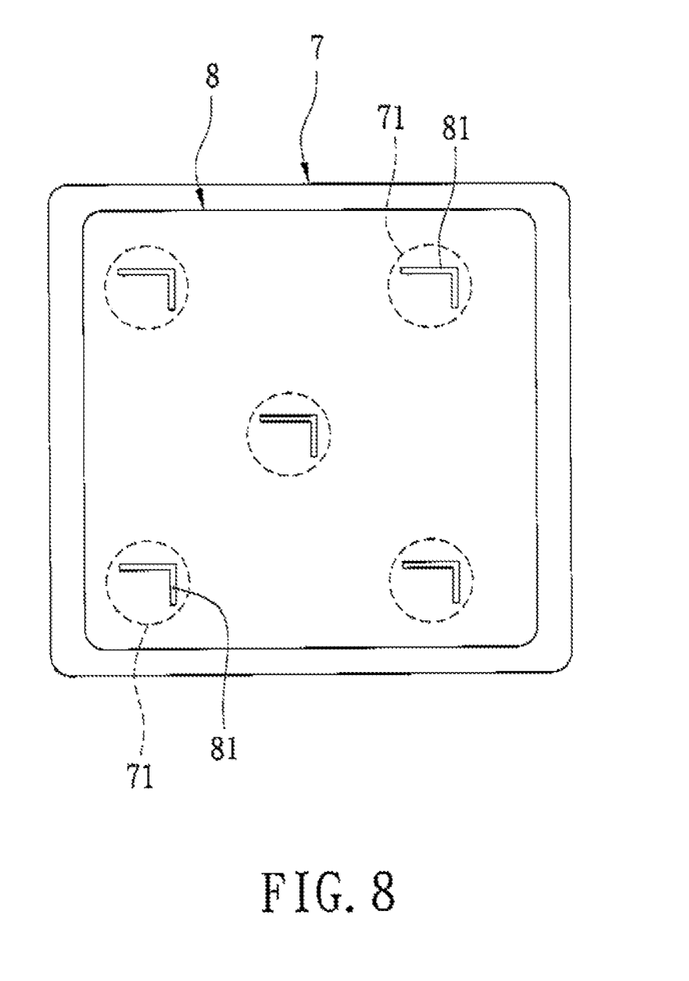
FIG. 8 is a top view of FIG. 7.
Figure 9:
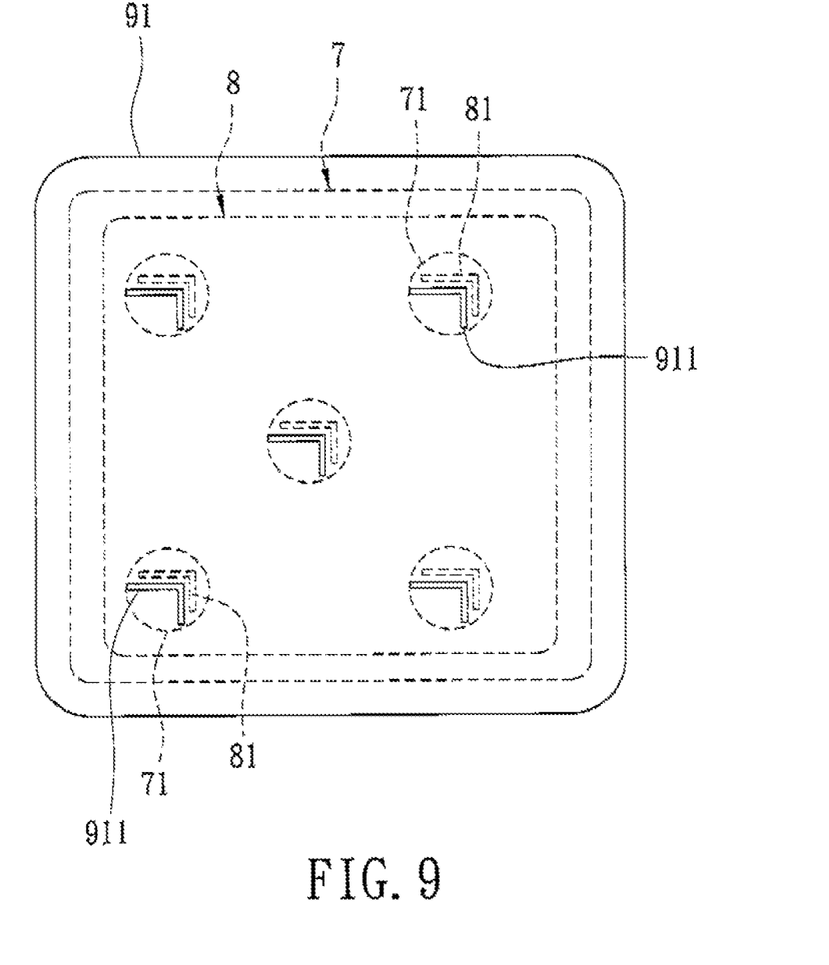
FIG. 9 is a top view illustrating alignment of a lithographic mask according to the preferred embodiment of the present invention.

Referring to FIGS. 7 to 9, the preferred embodiment of a method for aligning a lithographic mask 91 using an aligning device (not shown) according to the present invention is described below. The aligning device includes a base 7 that is formed with a plurality of separate light-transmissible sections 71. The lithographic mask 91 has mask alignment marks 911.

The method comprises: (a) disposing a light-transmissible film 8 on the base 7; (b) bombarding the light-transmissible film 8 at regions corresponding to the light-transmissible sections 71 of the base 7 so as to form film alignment marks 81 on the light-transmissible film 8 (see FIG. 8); (c) illuminating the light-transmissible sections 71 using a light source A such that the film alignment marks 81 serve as alignment references; and (d) disposing the lithographic mask 91 on the light-transmissible film 8 in a way that the mask alignment marks 911 on the lithographic mask 91 are aligned with the film alignment marks 81 on the light-transmissible film 8 (see FIG. 9).

Preferably, the light-transmissible sections 71 of the base 7 are through holes, and the electron beam is programmably controlled and may be derived from a laser apparatus or any other devices. It should be noted that the mask alignment marks 911 on the lithographic mask 91 and the film alignment marks 81 on the light-transmissible film 8 may be the same or different.

In the method for aligning the lithographic mask of the present invention, since the film alignment marks 81 on the light-transmissible film 8 are formed during the method instead of a separate process, the alignment of the film 8 is omitted, thereby simplifying the alignment method and improving the alignment accuracy.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for aligning a lithographic mask using an aligning device, the lithographic mask having mask alignment marks, the aligning device having a base that is formed with at least two separated light-transmissible sections, the method comprising:
   (a) disposing a light-transmissible film on the base;
   (b) bombarding the light-transmissible film at regions corresponding to the light-transmissible sections of the base using an electron beam so as to form film alignment marks on the light-transmissible film; and
   (c) disposing the lithographic mask on the light-transmissible film in a way that the mask alignment marks on the lithographic mask are aligned with the film alignment marks on the light-transmissible film.

2. The method of claim 1, wherein the electron beam is derived from laser.

3. The method of claim 1, wherein the light-transmissible sections are through holes.

* * * * *